US010355005B2

(12) United States Patent
Avci et al.

(10) Patent No.: US 10,355,005 B2
(45) Date of Patent: Jul. 16, 2019

(54) SEMI-VOLATILE EMBEDDED MEMORY WITH BETWEEN-FIN FLOATING-GATE DEVICE AND METHOD

(71) Applicant: INTEL CORPORATION, Santa Clara, CA (US)

(72) Inventors: Uygar E. Avci, Portland, OR (US); Daniel H. Morris, Hillsboro, OR (US); Ian A. Young, Portland, OR (US); Stephen M. Ramey, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,269

(22) PCT Filed: Jun. 26, 2015

(86) PCT No.: PCT/US2015/038079
§ 371 (c)(1),
(2) Date: Nov. 21, 2017

(87) PCT Pub. No.: WO2016/209280
PCT Pub. Date: Dec. 29, 2016

(65) Prior Publication Data
US 2018/0151578 A1 May 31, 2018

(51) Int. Cl.
*H01L 27/11521* (2017.01)
*G11C 16/04* (2006.01)
*H01L 21/28* (2006.01)
*H01L 29/49* (2006.01)
*H01L 29/78* (2006.01)
*H01L 29/788* (2006.01)
(Continued)

(52) U.S. Cl.
CPC .... *H01L 27/11521* (2013.01); *G11C 16/0408* (2013.01); *G11C 16/10* (2013.01);
(Continued)

(58) Field of Classification Search
CPC ............. H01L 27/11521; G11C 16/0408
(Continued)

(56) References Cited

U.S. PATENT DOCUMENTS 6,958,512 B1 * 10/2005 Wu ............... H01L 29/42324
257/315
8,592,889 B1 11/2013 Chen
(Continued)

OTHER PUBLICATIONS

International Search Report and Written Opinion, dated Mar. 28, 2016, issued in related International Application No. PCT/US2015/038079, 9 pages.
(Continued)

*Primary Examiner* — Igwe U Anya
(74) *Attorney, Agent, or Firm* — Schwabe, Williamson & Wyatt, P.C.

(57) ABSTRACT

Embodiments of the present disclosure provide techniques and configurations for semi-volatile embedded memory with between-fin floating gates. In one embodiment, an apparatus includes a semiconductor substrate and a floating-gate memory structure formed on the semiconductor substrate including a bitcell having first, second, and third fin structures extending from the substrate, an oxide layer disposed between the first and second fin structures and between the second and third fin structures, a gate of a first transistor disposed on the oxide layer and coupled with and extending over a top of the first fin structure, and a floating gate of a second transistor disposed on the oxide layer between the second and third fin structures. Other embodiments may be described and/or claimed.

24 Claims, 11 Drawing Sheets

(51) Int. Cl.

| | |
|---|---|
| *H01L 27/11519* | (2017.01) |
| *H01L 27/11558* | (2017.01) |
| *G11C 16/10* | (2006.01) |
| *G11C 16/14* | (2006.01) |
| *G11C 16/26* | (2006.01) |
| *H01L 27/11526* | (2017.01) |
| *H01L 29/66* | (2006.01) |
| *H01L 21/762* | (2006.01) |
| *H01L 27/02* | (2006.01) |
| *H01L 29/06* | (2006.01) |

(52) U.S. Cl.
CPC ............. *G11C 16/14* (2013.01); *G11C 16/26* (2013.01); *H01L 21/28079* (2013.01); *H01L 21/28088* (2013.01); *H01L 21/28273* (2013.01); *H01L 27/11519* (2013.01); *H01L 27/11526* (2013.01); *H01L 27/11558* (2013.01); *H01L 29/495* (2013.01); *H01L 29/4916* (2013.01); *H01L 29/4966* (2013.01); *H01L 29/66795* (2013.01); *H01L 29/66825* (2013.01); *H01L 29/78* (2013.01); *H01L 29/788* (2013.01); *H01L 29/7851* (2013.01); *H01L 29/7881* (2013.01); *H01L 21/76224* (2013.01); *H01L 27/0207* (2013.01); *H01L 29/0649* (2013.01)

(58) Field of Classification Search
USPC ........................................................ 257/316
See application file for complete search history.

(56) References Cited

U.S. PATENT DOCUMENTS

| | | | |
|---|---|---|---|
| 8,716,803 B2 | 5/2014 | Wang | |
| 2005/0266638 A1* | 12/2005 | Cho | H01L 21/28273 438/257 |
| 2007/0072369 A1* | 3/2007 | Young | H01L 27/115 438/257 |
| 2007/0247906 A1* | 10/2007 | Watanabe | G11C 16/0483 365/185.14 |
| 2007/0284650 A1* | 12/2007 | Willer | H01L 27/115 257/324 |
| 2008/0191247 A1* | 8/2008 | Yin | H01L 21/8221 257/204 |
| 2008/0277714 A1* | 11/2008 | Kim | H01L 27/115 257/321 |
| 2008/0285344 A1* | 11/2008 | Ruttkowski | H01L 27/0207 365/185.05 |
| 2011/0057247 A1 | 3/2011 | Hu et al. | |
| 2012/0112261 A1 | 5/2012 | Zhu et al. | |
| 2014/0097483 A1 | 4/2014 | Wang | |
| 2015/0035039 A1* | 2/2015 | Li | H01L 21/845 257/316 |

OTHER PUBLICATIONS

Extended European Search Report dated Jan. 23, 2019 for European Patent Application No. 15896566.5, 9 pages.

* cited by examiner

SEMI-VOLATILE EMBEDDED MEMORY WITH BETWEEN-FIN FLOATING-GATE DEVICE AND METHOD

CROSS REFERENCE TO RELATED APPLICATIONS

The present application is a national phase entry under 35 U.S.C. § 371 of International Application No. PCT/US2015/038079, filed Jun. 26, 2015 entitled "SEMI-VOLATILE EMBEDDED MEMORY WITH BETWEEN-FIN FLOATING-GATE DEVICE AND METHOD," which designates the United States of America, the entire disclosure of which is hereby incorporated by reference in its entirety and for all purposes.

FIELD

Embodiments of the present disclosure generally relate to the field of integrated circuits, and more particularly, techniques and configurations for floating-gate memory devices.

BACKGROUND

Integrated circuit (IC) devices including, for example, logic and/or memory devices continue to scale to smaller sizes and multiple logic components may be integrated into a system on a chip (SoC). In some cases, it may be desired to integrate memory on the same chip as logic circuitry. However, integrating conventional flash memory on the same chip as logic circuitry may have a detrimental effect on the performance of logic transistors and may require many additional processing steps resulting in a significantly increased cost of production.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
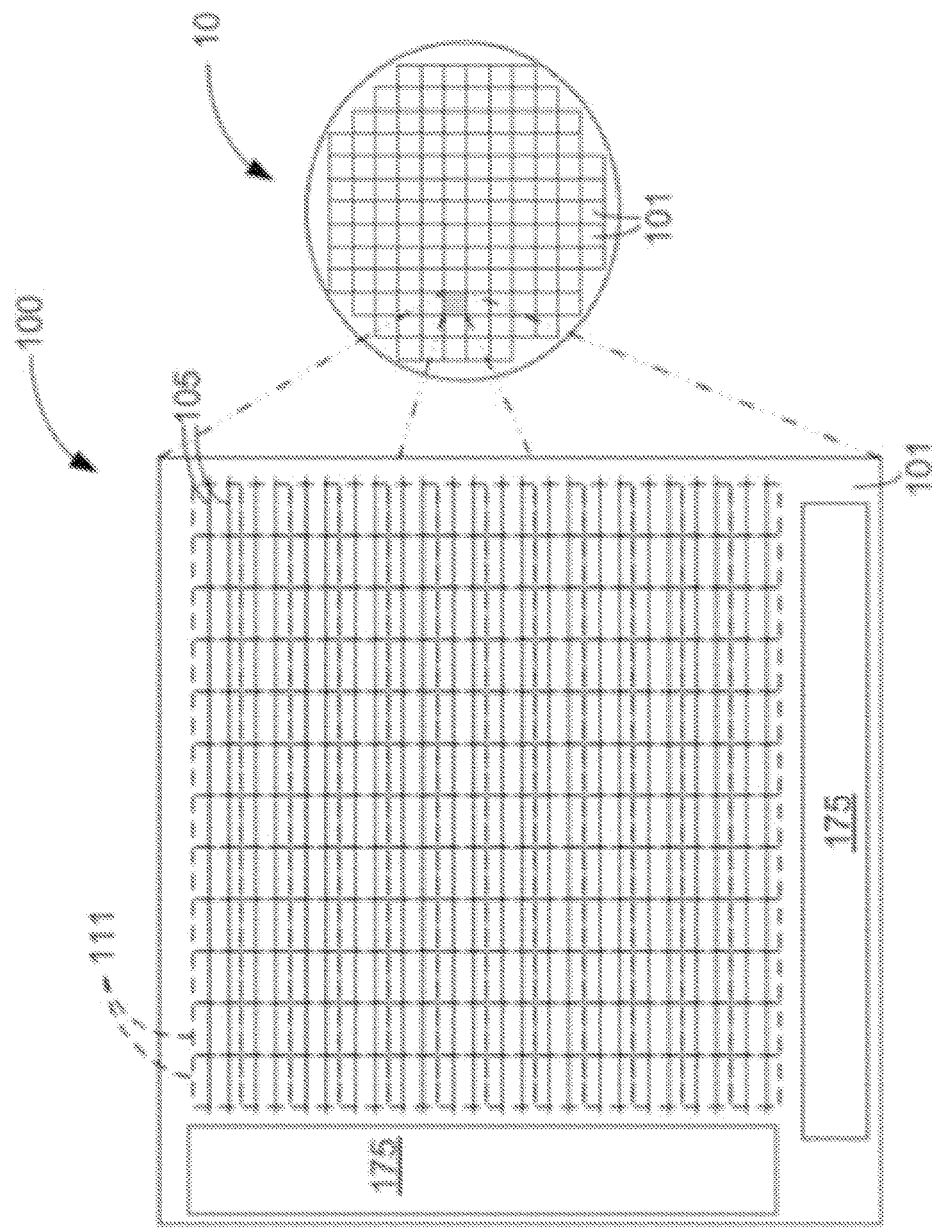
FIG. 1 schematically illustrates a top view of an integrated circuit (IC) device in die form and wafer form, in accordance with some embodiments.

Embodiments of the present disclosure provide techniques and configurations for semi-volatile embedded memory with between-fin floating gates of an integrated circuit (IC) device. In the following description, various aspects of the illustrative embodiments may be described using terms commonly employed by those skilled in the art to convey the substance of their work to others skilled in the art. However, it may be apparent to those skilled in the art that various embodiments may be practiced with only some of the described aspects. For purposes of explanation, specific numbers, materials and configurations may be set forth in order to provide an understanding of the illustrative embodiments. However, it may be apparent to one skilled in the art that some or all of the various embodiments may be practiced without the specific details. In other instances, well-known features may be omitted or simplified in the description in order not to obscure the illustrative embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an IC device 100 in die form and wafer form that may include a semi-volatile embedded memory with between-fin floating gates, in accordance with some embodiments. In some embodiments, the IC device 100 may be one of a plurality of IC devices formed on a wafer 10 composed of semiconductor material. The wafer 10 may include one or more dies (hereinafter "dies 101") formed on a surface of the wafer 10. Each of the dies 101 may be a repeating unit of a semiconductor product that includes the IC device 100. In some embodiments, the wafer 10 may undergo a singulation process in which each of the dies 101 is separated from one another to provide discrete "chips" of the semiconductor product. The wafer 10 may include a variety of sizes. In some embodiments, the wafer 10 may have a diameter ranging from about 25.4 mm to about 450 mm. The wafer 10 may include other sizes and/or other shapes in other embodiments.

According to various embodiments, the IC device 100 may be in wafer 10 form (e.g., not singulated) or die form (e.g., singulated). In some embodiments, the IC device 100 may correspond with or be part of a die of the dies 101. In FIG. 1, one of the dies 101 (shaded in wafer 10) including the IC device 100 is depicted in an exploded view. The IC device 100 may include one or more transistors configured in a repeating array of unit cells 111, as can be seen. The transistors of the unit cells 111 may include, for example, storage elements (e.g., cells) arranged in pages, sectors, blocks, lines, or other configurations.

The one or more transistors of the unit cells 111 may store information of the IC device 100 or facilitate access to, e.g., read and/or write information to the storage elements. According to various embodiments, the one or more transistors may be formed using one or more fin structures (hereinafter "fin structures 105") as described herein. In some embodiments, the fin structures 105 may extend across multiple unit cells 111 of a row or column of unit cells 111, as depicted. In some embodiments, two fin structures of the fin structures 105 may be common to unit cells 111 arranged in a row or column. In some embodiments, the fin structures 105 may extend across multiple unit cells 111, but may have breaks in the fin structure as it extends across some of the unit cells to create separate fin structures.

The IC device 100 may include additional components and/or elements. For example, the IC device 100 may further include select/decode modules 175 to facilitate access transactions (e.g., read/write operations) performed on storage elements of the IC device 100. In various embodiments, the select/decode modules 175 may include circuitry having a plurality of transistors. In some embodiments, the IC device 100 can include memory and/or logic devices combined on a single die. For example, a memory device may be formed on a same die 101 as a processor (e.g., processor 1204 of FIG. 12) or other logic that is configured to store information in the memory device or execute instructions of the memory device. For example, the IC device 100 may include a processor and cache formed on the same die in some embodiments. The IC device 100 may be a system on a chip (SoC) having both logic circuitry and semi-volatile embedded memory with between-fin floating gates in various embodiments.

The particular configuration of the IC device 100 of FIG. 1 is one example and other configurations may be used in various embodiments. For example, the select/decode modules 175 may be positioned in a variety of other suitable configurations relative to the fin structures 105 or may not be included at all and/or the fin structures 105 may extend in other directions in other embodiments.

Figure 9:
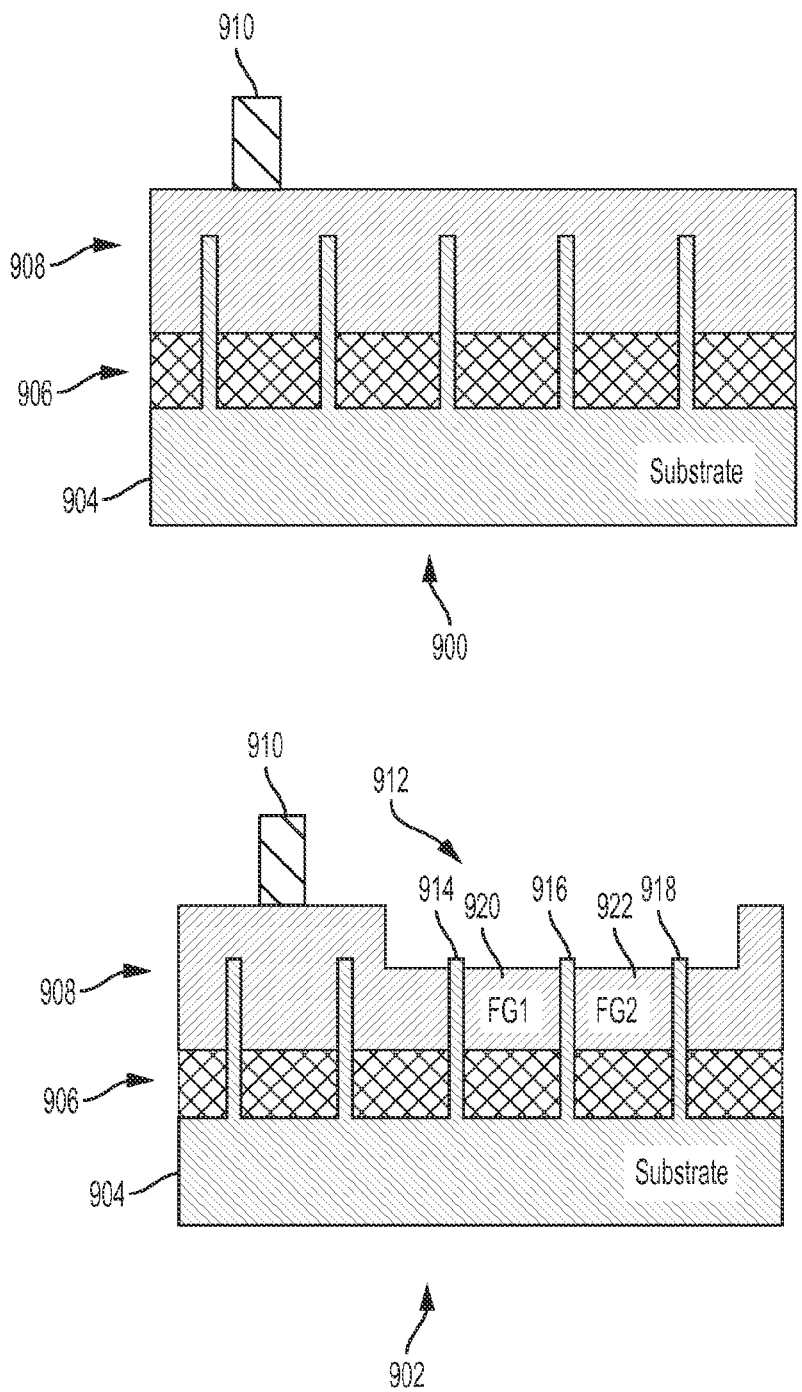
FIG. 9 schematically illustrates a cross-sectional side view showing formation of a floating-gate memory structure, in accordance with some embodiments.

According to various embodiments, the IC device 100 may be formed on a semiconductor substrate such as the substrate 904 of FIG. 9. The wafer 10 may include the semiconductor substrate in various embodiments. The semiconductor substrate may include N-type or P-type off-oriented silicon. The semiconductor substrate may include material with an off-cut orientation to reduce anti-phase boundaries or may not have an off-cut orientation in various embodiments. The semiconductor substrate may have a high resistivity between about 1 Ω-cm to about 50 kΩ-cm in some embodiments.

The semiconductor substrate may be a crystalline substrate formed using a bulk silicon or a silicon-on-insulator substructure in some embodiments. In various embodiments, the semiconductor substrate may be formed using alternate materials, which may or may not be combined with silicon, that may include but are not limited to germanium, indium antimonide, lead telluride, indium arsenide, indium phosphide, gallium arsenide, or gallium antimonide. Further materials classified as group III-V or group IV materials may also be used to form the substrate. Although a few examples of materials from which the semiconductor substrate may be formed are described here, any material that may serve as a foundation upon which a semiconductor device may be built may be used in various embodiments. The semiconductor substrate may include other materials in other embodiments. In some embodiments, the semiconductor substrate may be part of a singulated die (e.g., dies 101) or a wafer (e.g., wafer 10).

In some embodiments, one or more buffer layers (not shown) may be formed on the semiconductor substrate. The buffer layer may, for example, fill terraces of the semiconductor substrate with atomic bi-layers of a semiconductor material including, for example, one or more group III-V semiconductor materials and/or one or more group II-VI semiconductor materials, or combinations thereof. In some embodiments, the buffer layer may provide a virtual polar semiconductor substrate. The buffer layer may further serve as a buffer against dislocation threading and/or provide control of a lattice mismatch (e.g., stress relaxation) between the semiconductor substrate and other layers. The buffer layer may include N-type or P-type material systems. In embodiments, the buffer layer may include gallium arsenide (GaAs). In embodiments, the buffer layer may be deposited by an epitaxial deposition process. An epitaxial deposition process may include, for example, molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

Figure 2:
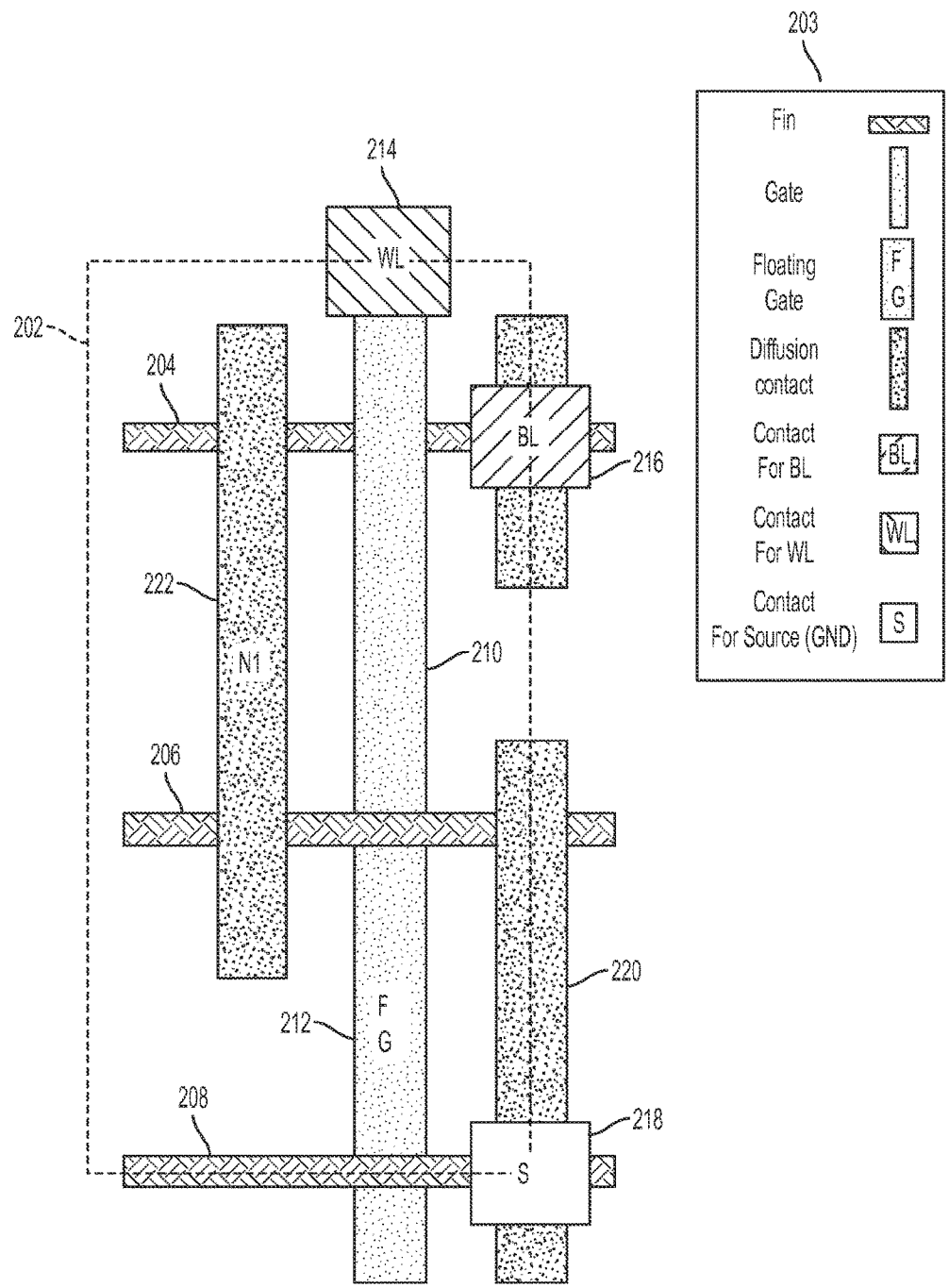
FIG. 2 schematically illustrates a top view of a layout of a floating-gate memory unit bitcell of an IC device, in accordance with some embodiments.

FIG. 2 schematically illustrates a top view of a layout of a between-fin floating-gate memory unit bitcell 202 of an IC device, in accordance with some embodiments. The between-fin floating-gate memory unit bitcell 202 may be a bitcell for dynamic semi-volatile memory in various embodiments. A legend 203 is provided so the relative positions of the fins, gates, floating gates, diffusion contacts, contacts for bitlines (BL), contacts for wordlines (WL), and contacts for source (S) can be more easily distinguished in the between-fin floating-gate memory unit bitcell 202. The between-fin floating-gate memory unit bitcell 202 may represent a layout of a single unit cell of the unit cells 111 of FIG. 1, in some embodiments. The between-fin floating-gate memory unit bitcell 202 may repeat multiple times in a design of an IC device such as the IC device 100. According to various embodiments, the between-fin floating-gate memory unit bitcell 202 may include a first fin structure 204, a second fin structure 206, and a third fin structure 208 formed on and/or extending from a semiconductor substrate (e.g., semiconductor substrate 904 of FIG. 9). In some embodiments, the first, second, and third fin structures 204, 206, and 208 may extend in parallel in relation to each other. An oxide layer (e.g., oxide layer 906 of FIG. 9) may be disposed between the first, second, and third fin structures 204, 206, and 208. In various embodiments, the between-fin floating-gate memory unit bitcell 202 may be a two transistor bitcell, as shown. A pass transistor of the between-fin floating-gate memory unit bitcell 202 may provide isolation and improve disturb immunity in various embodiments. In some embodiments, bitcells with other numbers of transistors may be used, such as a single transistor bitcell, for example.

A gate 210 may be coupled with and extend over a top of the first fin structure 204 in some embodiments. The gate 210 may be a wordline gate in various embodiments. A floating gate 212 may be disposed between the second fin structure 206 and the third fin structure 208 in various embodiments. In various embodiments, the floating gate 212 may be a floating gate in that it may be electrically isolated between the second fin structure 206 and the third fin structure 208 and may be capable of holding an electric charge. In embodiments, a lithography and etching process may be used to create a gate line isolated between the second fin structure 206 and the third fin structure 208 to be used as the floating gate 212. A contact 214 for a wordline may be coupled with the gate 210 and a contact 216 for a bitline may be coupled with the first fin structure 204 in various embodiments. A contact 218 for source (or Ground (GND)) may be coupled with the third fin structure 208 and a diffusion contact 220 may be coupled with the second fin structure 206, the third fin structure 208, and the contact 218, in some embodiments. A diffusion contact 222 may extend between and be coupled with the first fin structure 204 and the second fin structure 206. In embodiments, the between-fin floating-gate memory unit bitcell 202 may have a first dimension, D1, along a first side of 2.5 diffusion pitch and a second dimension, D2, along a second side of 1.5 polysilicon pitch. In embodiments, an inner node may be located at the diffusion contact 222.

In various embodiments, the between-fin floating-gate memory unit bitcell 202 may have a write voltage in a range from greater than or equal to approximately 1.5 Volts (V) to less than or equal to approximately 2 V. In some embodiments, the between-fin floating-gate memory unit bitcell 202 may have a write voltage outside of that range. In various embodiments, the between-fin floating-gate memory unit bitcell 202 may have a retention time in a range from greater than or equal to approximately 10 seconds to less than or equal to approximately one hour. In other embodiments, the between-fin floating-gate memory unit bitcell 202 may have a retention time outside of that range. In various embodiments, the between-fin floating-gate memory unit bitcell 202 may have a write speed in a range from greater than or equal to approximately 0.1 nanoseconds to less than or equal to approximately 100 nanoseconds. In other embodiments, the between-fin floating-gate memory unit bitcell 202 may have a write speed outside of that range.

In some embodiments, one or more of the contact 214, the contact 216, or the contact 218 may have a width that is greater than a width, W, of the fin structures 204, 206, and 208, as can be seen. The contacts 216, 218, or the gate 210 may wrap around the fin structures 204, 206, or 208 in some embodiments. In various embodiments, the contact 216 or 218 may function as a source terminal (e.g., supplier of electrons) or drain terminal (e.g., receiver of electrons).

According to various embodiments, the fin structures 204, 206, 208 may extend across the between-fin floating-gate memory unit bitcell 202 in parallel, as can be seen. The fin structures 204, 206, 208 may extend across multiple unit cells (e.g., unit cells 111 of FIG. 1) in some embodiments. Thus, transistors of multiple unit cells may be formed on a same fin structure of the fin structures 204, 206, 208. In other embodiments, the unit bitcell layout 202 may include more or fewer fin structures than depicted.

In various embodiments, the fin structures 204, 206, or 208 may function as a channel between a source and a drain region or may include more than one channel layer. The fin structures 204, 206, or 208 may include a variety of suitable materials including N-type and/or P-type material systems. In some embodiments, the fin structures 204, 206, or 208 may include a semiconductor material such as, for example, a group IV, group III-V or group II-VI semiconductor material. The material of the fin structures may include a nanowire material. In some embodiments, the materials for the fin structures 204, 206, or 208 may include material systems including gallium (Ga), arsenic (As), Indium (In), antimony (Sb), germanium (Ge), silicon (Si), and the like, or combinations thereof. For example, the fin structure 204, 206, or 208 may include germanium (Ge), silicon germanium (SiGe), indium antimonide (InSb), gallium antimonide (GaSb), indium gallium antimonide (InGaSb), gallium arsenide (GaAs), indium gallium arsenide (InGaAs), the like, or combinations thereof. Other suitable channel materials may be used in other embodiments.

An electrically insulative material such as an interlayer dielectric (ILD) material may be deposited and/or otherwise formed to isolate components of an IC device such as the IC device 100 that may include the between-fin floating-gate memory unit bitcell 202. In the depicted top view of FIG. 2, ILD material that may cover portions of the fin structures 204, 206, or 208 is not shown to avoid obscuring underlying features. Although not shown, the between-fin floating-gate memory unit bitcell 202 may further include additional electrically conductive structures to facilitate routing of electrical current in an IC device such as the IC device 100.

The electrically insulative material such as, for example, ILD material, may be deposited to electrically insulate the electrically conductive structures from one another in an IC device such as the IC device 100 that may include the bitcell layout 202. A plurality of ILD layers may be deposited in some embodiments. The ILD layers may be formed using dielectric materials known for their applicability in integrated circuit structures, such as low-k dielectric materials. Examples of dielectric materials that may be used include, but are not limited to, silicon oxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or other voids to further reduce their dielectric constant. The ILD material may include other suitable materials in other embodiments.

An isolation layer may provide an electrically insulative barrier for the fin structures in some embodiments. The isolation may include the insulative material described above or may be a separate layer in various embodiments. According to various embodiments, the isolation layer may include an electrically insulative material relative to the material of the fin structures 204, 206, and 208. The material deposited to form the isolation layer may include, for example, group IV, group III-V, or group II-VI semiconductor materials and/or other electrically insulative materials such as silicon oxide ($SiO_2$) and the like. For example, in some embodiments, the material of the isolation layer may include $SiO_2$, aluminum (Al), arsenic (As), gallium (Ga), antimony (Sb), Indium (In), and/or combinations thereof. Other or additional material may be used in other embodiments.

The material for the isolation layer may be selected based on lattice-matching to adjacent layers, electrical isolation properties, and/or etch selectivity for an etching process that forms the contacts and/or gates. For example, a material may be selected that allows etching of the material of the isolation layer, but not the fin structures.

The contacts 216 or 218 may be coupled in direct electrical contact with the corresponding fin structure 204 or 208 (e.g., no intervening dielectric material between the material of the contacts and the channel layers). The gate 210 may be capacitively coupled with the first fin structure 204 (e.g., dielectric material may be disposed between the material of the gate and the fin structure). In some embodiments, the gate 210 may be configured to control current flow in the first fin structure 204 between the contact 216 and the diffusion contact 222. In various embodiments, the gate 210 and/or the floating gate 212 may be formed of polycrystalline silicon (polysilicon). In some embodiments, the gate 210 and/or the floating gate 212 may be formed of or include a metal. The gate 210 and/or the floating gate 212 may be formed of other materials in various embodiments.

Materials for the contact 214, the contact 216, the contact 218, the gate 210, the floating gate 212, and/or the diffusion contact 222 may include any suitable electrically conductive material including, for example, metal. In some embodiments, the contacts 214, 216, 218, 222, and/or the gate 210 or floating gate 212 may include copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof. In some embodiments, the contacts 214, 216, 218, 222, and/or the gate 210 or floating gate 212 may include a metal nitride such as, for example, titanium nitride (TiN), tungsten nitride (WN), or tantalum nitride (TaN), or combinations thereof. In some embodiments, the contacts 214, 216, 218, 222, and/or the gate 210 or floating gate 212 may include a metal silicide such as, for example, titanium silicide (TiSi), tungsten silicide (WSi), tantalum silicide (TaSi), cobalt silicide (CoSi), platinum silicide (PtSi), nickel silicide (NiSi), or combinations thereof. In some embodiments, the contacts 214, 216, 218, 222, and/or the gate 210 or floating gate 212 may include a metal silicon nitride such as, for example, titanium silicon nitride (TiSiN), or tantalum silicon nitride (TaSiN), or combinations thereof. In some embodiments, the contacts 214, 216, 218, 222, and/or the gate 210 or floating gate 212 may include a metal carbide such as, for example, titanium carbide (TiC), zirconium carbide (ZrC), tantalum carbide (TaC), hafnium carbide (HfC), or aluminum carbide (AlC), or combinations thereof. In some embodiments, the contacts 214, 216, 218, 222, and/or the gate 210 or floating gate 212 may include a metal carbon nitride such as, for example, tantalum carbon nitride (TaCN), titanium carbon nitride (TiCN), or combinations thereof. In some embodiments, the contacts 214, 216, 218, 222, and/or the gate 210 or floating gate 212 may include conductive metal oxides (e.g., ruthenium oxide). The materials may further include P-type workfunction or N-type workfunction materials depending on whether the transistor is to be a P-type or N-type transistor. In some embodiments, multiple layers of different materials may be used to form the contacts 214, 216, 218, 222, and/or the gate 210 or floating gate 212. The contacts 214, 216, 218, 222, and/or the gate 210 or floating gate 212 may include other suitable materials in other embodiments.

In some embodiments, a pair of spacers (not shown) may bracket the gate 210 or the floating gate 212. The spacers may be formed from a material such as silicon nitride, silicon oxide, silicon carbide, silicon nitride doped with carbon, or silicon oxynitride. Processes for forming spacers are well known in the art and generally include deposition and etching process steps.

In some embodiments, the contacts 214, 216, 218, and/or 222 may have a tapered profile shape with a wider dimension at the top and narrower dimension at the bottom. The wider dimension at the top of the contacts 214, 216, 218, and/or 222 may reduce parasitic external resistance (Rext) of the IC device 100 and the narrower dimension at the bottom may facilitate scaling to smaller sizes in the transistor regions by providing more space for transistors in various embodiments. The profile of the contacts 214, 216, 218, and/or 222 may be achieved, for example, by a wet/dry etch patterning process that provides sloped sidewalls in a contact trench formed by the patterning process.

In some embodiments, the gate 210 and/or floating gate 212 may have a more rectangular shaped profile relative to the contacts 214, 216, 218, and 222. That is, in some embodiments, the contacts 214, 216, 218, 222 may have a profile that is more tapered relative to a profile of the gate 210 and floating gate 212. The profile of the gate 210 and floating gate 212 may be more rectangular as a result of a patterning process that may be used to form the gate 210 and floating gate 212. For example, a replacement metal gate (RMG) process may be used to form the gate 210 or floating gate 212 such that a dummy gate is first formed using a sacrificial material that is subsequently removed and replaced with another gate material.

In some embodiments, a gate dielectric film may be formed on the first fin structure 204 to provide capacitive coupling between the first fin structure 204 and the gate 210. The gate dielectric film may be conformally deposited on the material of the first fin structure 204. The gate dielectric film may include a variety of suitable dielectric materials including high-k materials. In some embodiments, the gate dielectric film may include, for example silicon oxide ($SiO_2$), silicon oxynitride ($SiO_xN_y$), silicon nitride ($Si_xN_y$) aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, where x, y, and z represent suitable quantities of the respective elements. In some embodiments, an annealing process may be carried out on the gate dielectric film to improve its quality when a high-k material is used. Other materials may be used in other embodiments for the gate dielectric film. In some embodiments, a gate dielectric film may not be present.

According to various embodiments, the gate 210 may be arranged in a tri-gate configuration around the first fin structure 204. The tri-gate configuration may include material of the gate 210 coupled to three surfaces of the first fin structure 204 that are each configured about 90 degrees relative to an adjacent surface of the three surfaces where two of the surfaces are substantially parallel. Due to etching or other manufacturing processes the three surfaces of the tri-gate configuration may have rounded edges where they coincide. The gate 210 may be arranged in a different configuration in other embodiments.

The contacts 214, 216, 218, and/or 222 may include analogous tri-contact configurations based on the principles described in connection with the gate 210. A tri-contact configuration may provide a similar configuration as a respective tri-gate, but for a contact instead of a gate. For example, in some embodiments, the contact 214 may form a tri-contact configuration with the gate 210. The contact 216 may form a tri-contact configuration with the first fin structure 204 or a diffusion contact coupled with the first fin structure 204. The contact 218 may form a tri-contact configuration with the third fin structure 208 or a diffusion contact coupled with the third fin structure 208. Other gate or contact configurations may be used in various embodiments.

In some embodiments, the fin structures may include electrically conductive channel layers isolated from one another by electrically insulative isolation layers. For example, the fin structures may each include a first channel layer and a second channel layer formed on the first channel layer. Transistors may be formed in a stacked three-dimensional (3D) configuration using the first channel layer and the second channel layer. Channel layer contacts may be coupled to the first channel layer and/or second channel layer to route electrical current in the IC device.

Figure 3:
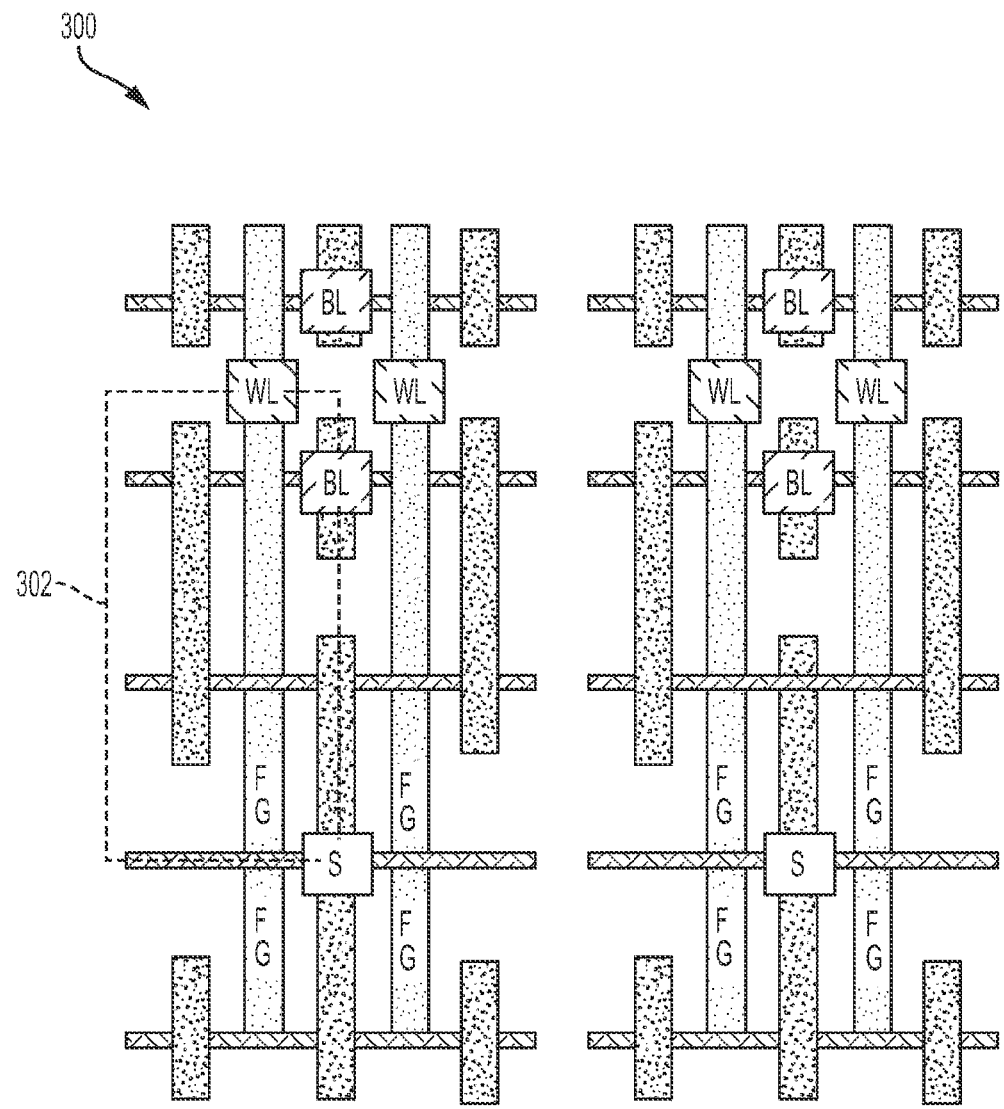
FIG. 3 schematically illustrates a top view of a floating-gate memory layout of an IC device, in accordance with some embodiments.

FIG. 3 schematically illustrates a top view of a between-fin floating-gate memory layout 300 of an IC device, in accordance with some embodiments. The between-fin floating-gate memory layout 300 may include a unit bitcell 302 that may be configured as described with respect to the between-fin floating-gate memory unit bitcell 202 in various embodiments. In some embodiments, additional unit bitcells may be configured as shown in the between-fin floating-gate memory layout 300. The legend 203 of FIG. 2 may also be used to more easily distinguish the relative positions of the fins, gates, floating gates, diffusion contacts, contacts for bitlines (BL), contacts for wordlines (WL), and contacts for source (S) in the between-fin floating-gate memory layout 300.

Figure 4:
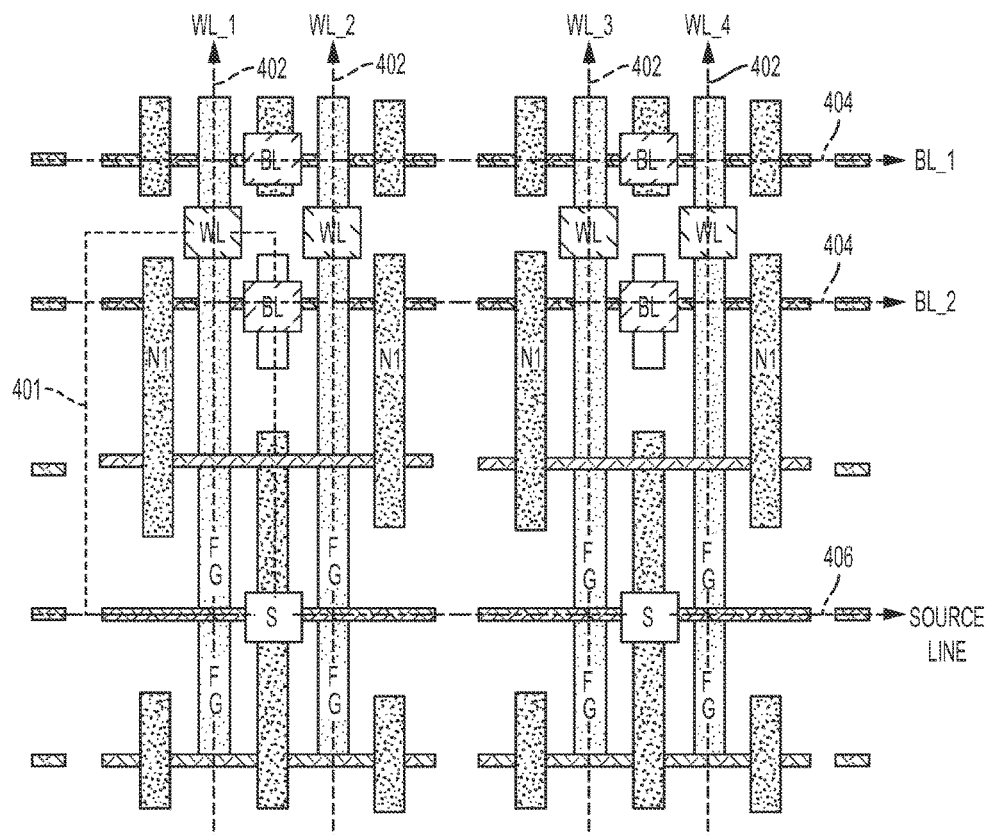
FIG. 4 schematically illustrates top view of a floating-gate memory layout including wordline, bitline, and source line metal positions, in accordance with some embodiments.

FIG. 4 schematically illustrates top view of a between-fin floating-gate memory layout 400 including wordline, bitline, and source line metal positions, in accordance with some embodiments. The between-fin floating-gate memory layout 400 may be configured as shown and described with respect to the floating-gate memory layout 300 of FIG. 3 in some embodiments. The legend 203 may be also be used with respect to the between-fin floating-gate memory layout 400 in some embodiments. In various embodiments, the between-fin floating-gate memory layout 400 may include wordline metal lines 402 for each of a first wordline WL_1, a second wordline WL_2, a third wordline WL_3, and a fourth wordline WL_4. The floating-gate memory layout 400 may include bitline metal lines 404 for each of a first bitline BL_1 and a second bitline BL_2. The between-fin floating-gate memory layout 400 may include a source metal line 406 for a source line. In various embodiments, the source metal line may be coupled with a ground voltage at 0 V. In some embodiments, the source metal line 404 may be coupled with a different voltage.

Figure 5:
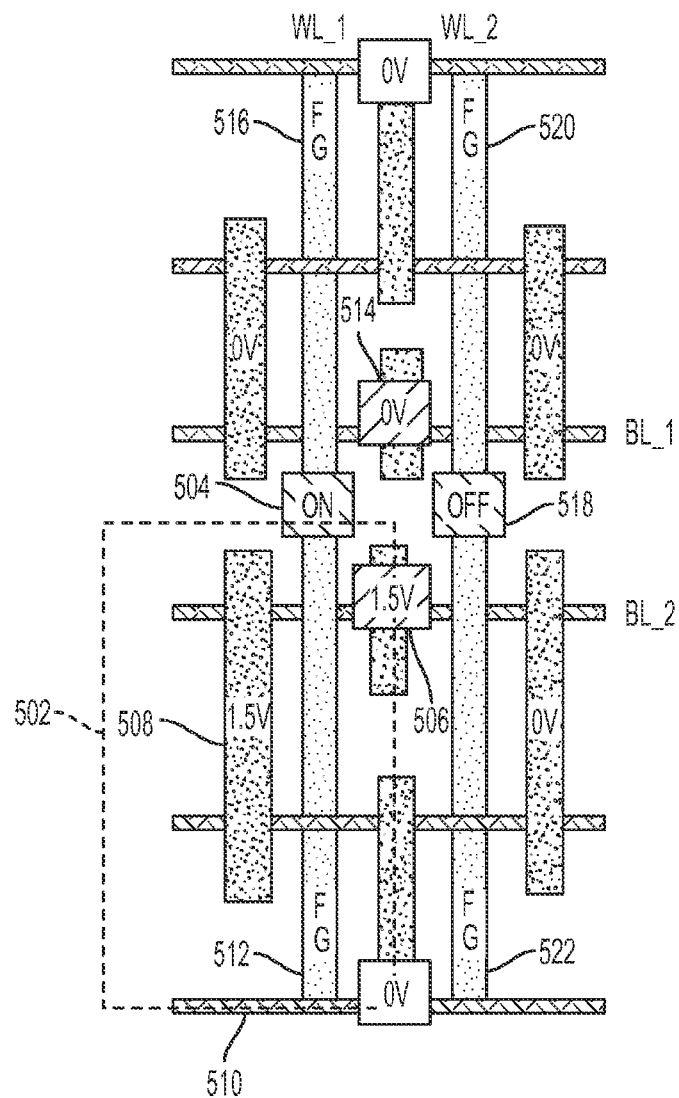
FIG. 5 schematically illustrates a top view of neighboring bitcells in a floating-gate memory layout in an example write operation, in accordance with some embodiments.

FIG. 5 schematically illustrates a top view of neighboring bitcells in a between-fin floating-gate memory layout 500 in an example write operation, in accordance with some embodiments. In some embodiments, an erase operation ("0" bit) may be performed before a write operation. A flash type erase may be performed by either biasing a source line (write-fin) or all the bitlines to a negative bias (e.g., −1.5V to −2 V). The between-fin floating-gate memory layout 500 may include a unit bitcell 502 that may be configured in a manner similar to that described with respect to the between-fin floating-gate memory unit bitcell 202 of FIG. 2 in some embodiments. In a write operation that may apply in various embodiments, a wordline WL_1, may be turned on at a wordline contact 504. A voltage, that may be approximately 1.5 V, may be applied to a bitline BL_2 at a bitline contact 506. The 1.5 V on BL_2 may be conducted through a pass transistor of the unit bitcell 502 to an inner node 508, which may create a voltage difference between a write-fin 510 that may be at 0 V and the inner node 508 at 1.5 V. In some embodiments, the voltage may leak through an oxide layer and increase a potential of a floating gate 512 in the unit bitcell 502 such that the floating gate 512 is in a '1' state. During the write operation, another bitline BL_1 may be kept at 0 V at a bitline contact 514. In embodiments, this may result in a floating gate 516 of the neighboring bitcell to not be charged, thus staying in a '0' state. Similarly, another wordline WL_2 may remain unselected with a voltage of 0 V at a wordline contact 518 during the write operation, which may result in states of a floating gate 520 and a floating gate 522 of unit bitcells coupled with the wordline WL_2 to remain unchanged because the bitline BL_2 voltage is blocked through the unselected gate voltage of the pass transistor.

In some embodiments, a read operation may be performed by selecting a wordline such as WL_1 or WL_2 and setting a bitline corresponding to a unit bitcell to be read to approximately 0.1V to prevent read-disturb. In various embodiments, write time and retention time of a unit bitcell may be estimated using gate oxide leakage estimates. In some embodiments, with a 1.5 nanometer (nm) equivalent oxide thickness (EOT), and using a 2V write voltage and keeping a disturb potential at approximately 0.1V next to the floating gate, the write time may be approximately 23 nanoseconds (ns) and the retention time may be approximately 1.1 hours. Generally, EOT may be a distance which indicates how thick a silicon oxide film would need to be to produce the same effect as the oxide material being used. In various embodiments, retention times may be increased by increasing oxide thickness, but increased write voltages may be used to maintain relatively short write times. In various embodiments, an oxide layer having a EOT less than or equal to 3 nanometers may be used. In some embodiments, an oxide layer with an EOT of approximately 1 nanometer may be used in conjunction with an approximate 2V write voltage while keeping a disturb potential of approximately 0.1V next to the floating gate, with a corresponding write time of approximately 76 picoseconds and a corresponding retention time of approximately 13 seconds. In other embodiments, an oxide layer with an EOT greater than 3 nanometers may be used.

Figure 6:
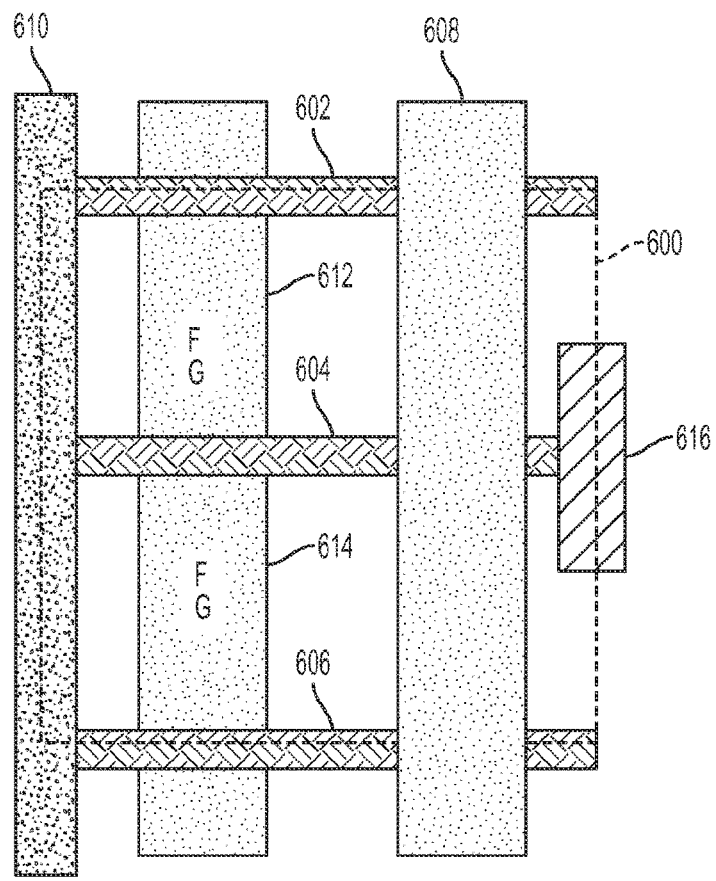
FIG. 6 schematically illustrates a top view of a layout of a floating-gate memory unit bitcell, in accordance with some embodiments.

FIG. 6 schematically illustrates a top view of a layout of a between-fin floating-gate memory unit bitcell 600, in accordance with some embodiments. The between-fin floating-gate memory unit bitcell 600 may represent a layout of a single unit cell of the unit cells 111 of FIG. 1, in some embodiments. The between-fin floating-gate memory unit bitcell 600 may repeat multiple times in a design of an IC device such as the IC device 100. The between-fin floating-gate memory unit bitcell 600 may be a bitcell for dynamic semi-volatile memory in various embodiments. The between-fin floating-gate memory unit bitcell 600 may include a first fin structure 602, a second fin structure 604, and a third fin structure 606 formed on and/or extending from a semiconductor substrate (e.g., semiconductor substrate 904 of FIG. 9). In some embodiments, the first, second, and third fin structures 602, 604, and 606 may extend in parallel in relation to each other. An oxide layer (e.g., oxide layer 906 of FIG. 9) may be disposed between the first, second, and third fin structures 602, 604, and 606.

A gate 608 may be coupled with and extend over a top of the first fin structure 602, a top of the second fin structure 604, and a top of the third fin structure 606 in various embodiments. A source line 610 may extend across and be coupled with the first, second, and third fin structures 602, 604, and 606 at a first side of the between-fin floating-gate memory unit bitcell 600. In some embodiments, the source line 610 may be coupled with and extend across the second fin structure 604 but may not be coupled with and/or may not extend across the first fin structure 602 and/or the third fin structure 606. A first floating gate 612 may be disposed between the first fin structure 602 and the second fin structure 604 at a location between the gate 608 and the source line 610. A second floating gate 614 may be disposed between the second fin structure 604 and the third fin structure 606 at a location between the gate 608 and the source line 610 in various embodiments.

In some embodiments, the first floating gate 612 and/or the second floating gate 614 may extend over one or more of the first fin structure 602, the second fin structure 604 or the third fin structure 606 but not extend into a neighboring bitcell such that it remains floating. In embodiments, the first floating gate 612 and the second floating gate 614 may both extend over the top of the second fin structure 604 such that they form a single floating gate which may also extend over the first fin structure 602 and the third fin structure 606 in some embodiments yet not extend into neighboring bitcells such that it remains a floating gate.

A contact 616 for a bitline may be coupled with the second fin structure 604 at a second side of the between-fin floating-gate memory unit bitcell 600. In some embodiments, the gate 608 may extend over the tops of the first, second, and third fin structures 602, 604, and 606 at a location between the contact 616 for the bitline and the source line 610. The between-fin floating-gate memory unit bitcell 600 may have a first dimension of 2 polysilicon pitch along a first side of the unit bitcell and a second dimension of 2 diffusion pitch along a second side of the unit bitcell in various embodiments. In various embodiments, the fin structures, gates, contacts, oxide layers, ILD, and/or other aspects shown or described with respect to FIG. 6 may be formed of materials and/or in a manner described with respect to the fin structures, gates, contacts, oxide layers, ILD, and/or other aspects of the unit bitcell 202 described with respect to FIG. 2.

In various embodiments, the between-fin floating-gate memory unit bitcell 600 may have a write voltage in a range from greater than or equal to approximately 1.5 V to less than or equal to approximately 2 V. In some embodiments, the between-fin floating-gate memory unit bitcell 600 may have a write voltage outside of that range. In various embodiments, the between-fin floating-gate memory unit bitcell 600 may have a retention time in a range from greater than or equal to approximately 10 seconds to less than or equal to approximately one hour. In other embodiments, the between-fin floating-gate memory unit bitcell 600 may have a retention time outside of that range. In various embodiments, the between-fin floating-gate memory unit bitcell 600 may have a write speed in a range from greater than or equal to approximately 0.1 nanoseconds to less than or equal to approximately 100 nanoseconds. In other embodiments, the between-fin floating-gate memory unit bitcell 600 may have a write speed outside of that range.

Figure 7:
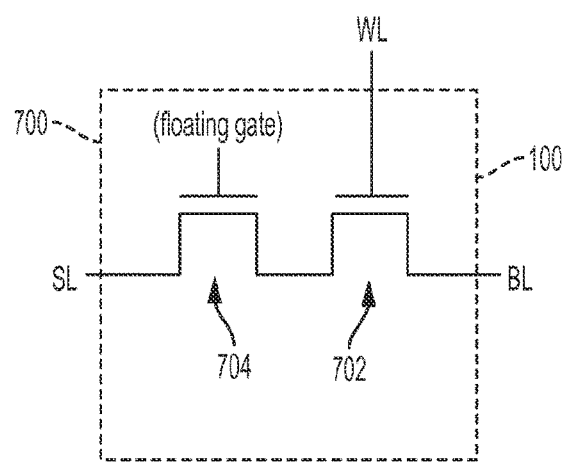
FIG. 7 schematically illustrates two transistors of a unit bitcell, in accordance with some embodiments.

FIG. 7 schematically illustrates two transistors of a unit bitcell 700, in accordance with some embodiments. The unit bitcell 700 may correspond to the between-fin floating-gate memory unit bitcell 600 of FIG. 6 in some embodiments. In some embodiments, the unit bitcell 700 may include a first transistor 702 with a gate corresponding to the gate 608, a first terminal coupled with a contact for a bitline such as the contact 616, and a second terminal coupled with a first terminal of a second transistor 704 having a floating gate corresponding to the first floating gate 612 and the second floating gate 614. In embodiments, the second transistor 704 may have a second terminal coupled with a source line such as the source line 610. In some embodiments, the first transistor 702 may be an access transistor and the second transistor 704 may be a multiple gate field-effect transistor (FET) such as a floating-gate FinFET. According to various embodiments, the transistors 702 and 704 may include nonplanar transistors such as dual- or double-gate transistors, tri-gate transistors, and all-around-gate (AAG) or wrap-around gate transistors, some of which are often referred to as FinFET transistors.

Figure 8:
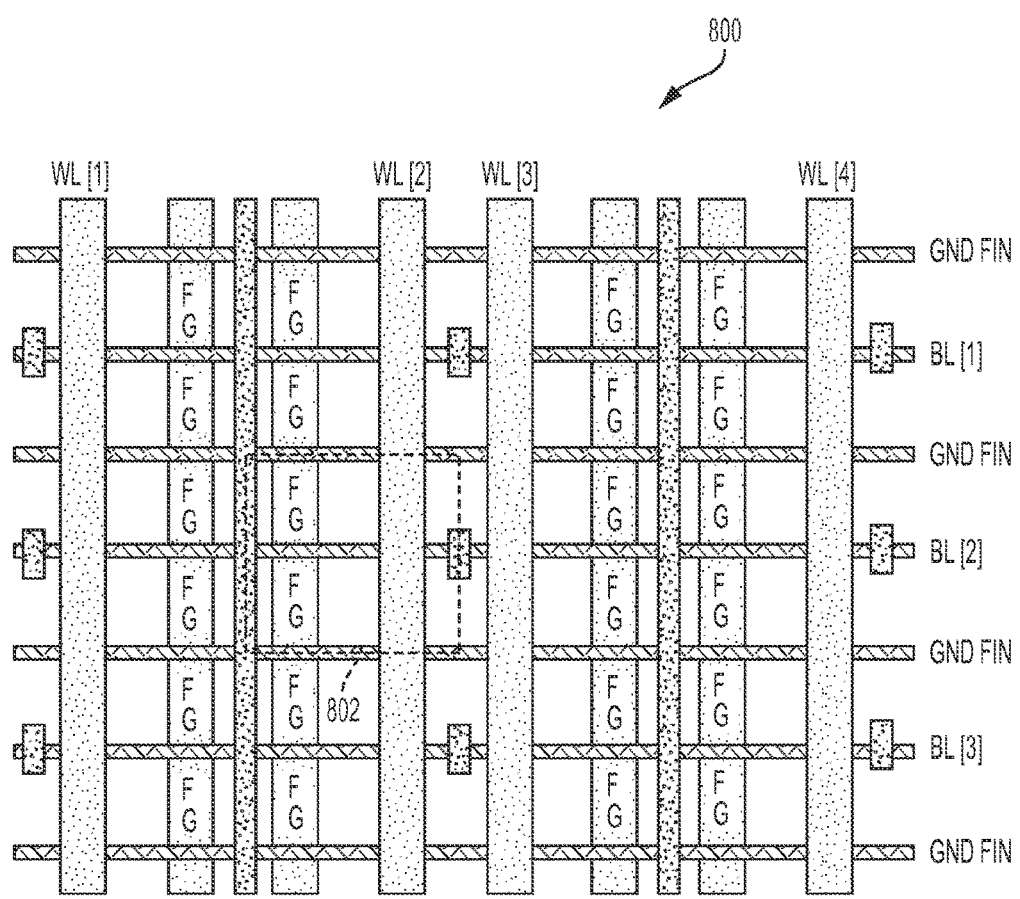
FIG. 8 schematically illustrates a top view of another floating-gate memory layout of an IC device, in accordance with some embodiments.

FIG. 8 schematically illustrates a top view of another between-fin floating-gate memory layout 800 of an IC device, in accordance with some embodiments. The between-fin floating-gate memory layout 800 may include a 4×3 array of unit bitcells, with a unit bitcell 802 corresponding to the between-fin floating-gate memory unit bitcell 600 of FIG. 6 and/or the unit bitcell 700 described with respect to FIG. 7 in various embodiments. The between-fin floating-gate memory layout 800 may include two floating gates per cell which may increase variation tolerance and improve the effect of floating-gate voltage on a read signal in various embodiments. An erase operation (write "0") may be performed selectively for each wordline rather than on a whole sub-array by not connecting shared source line to ground (GND) fin contacts in various embodiments.

FIG. 9 schematically illustrates a cross-sectional side view showing formation of a portion of a between-fin floating-gate memory structure that may be included in an IC device such as the IC device 100 of FIG. 1, in accordance with some embodiments. In various embodiments, the floating-gate memory structure may be formed using complementary metal oxide semiconductor (CMOS) processing techniques. For clarity, only two stages in the formation of the floating-gate memory structure are shown. In some embodiments, a first structure 900 may be formed before processing to form a floating-gate memory structure 902. The first structure may include a semiconductor substrate 904. The semiconductor substrate 904 may be formed of a substrate material as described with respect to FIG. 1 in various embodiments. A plurality of fins may be formed on and/or extend from the semiconductor substrate 904. An oxide layer 906 that may be a shallow trench isolation (STI) layer in various embodiments may be formed on the semiconductor substrate 904 and be disposed between the plurality of fins. A polysilicon layer 908 may be formed on the oxide layer 906 and extend over the tops of the plurality of fins. In some embodiments, the polysilicon layer 908 may be a gate. A contact 910 may be coupled with the polysilicon layer 908 and may be a gate contact in some embodiments. The first structure 900 may include one or more multi-gate devices such as FinFETS that may be Trigate devices in some embodiments. In some embodiments, the gate and/or floating gates may be formed of additional materials or materials other than polysilicon.

In various embodiments, floating gates may be formed from a structure such as the first structure 900 to produce the floating-gate memory structure 902. A lithography and etching process may be used to remove a portion of the polysilicon layer 908 in a floating-gate region 912. In some embodiments, a different type of gate material may be removed. Removal of a portion of the polysilicon layer 908 in the floating-gate region 912 may expose a first fin structure 914, a second fin structure 916, and a third fin structure 918. Removal of the portion of the polysilicon layer 908 in the floating-gate region 912 may also create a first floating gate 920 and a second floating gate 922. In various embodiments, the first floating gate 920 may be isolated between the first fin structure 914 and the second fin structure 916, and the second floating gate 922 may be isolated between the second fin structure 916 and the third fin structure 918. In some embodiments, a nitride cap layer may be present on the first fin structure 914, the second fin structure 916, and the third fin structure 918 such that the etching process removes material above the nitride cap layer but does not remove the fin structures below the nitride cap layer.

Aspects of the floating-gate memory structure 902 may correspond with portions of the between-fin floating-gate memory unit bitcell 202 of FIG. 2 or the floating-gate memory unit bitcell layout 600 of FIG. 6 in some embodiments. In various embodiments, the first fin structure 914 may correspond to the second fin structure 206, and the second fin structure 916 may correspond to the third fin structure 208 shown in FIG. 2, with the contact 910 corresponding to the contact 214 for a wordline. In some embodiments, the first, second, and third fin structures 914, 916, and 918 may correspond to the first, second, and third fin structures 602, 604, and 606, respectively, shown in FIG. 6, but the contact 910 and remaining portion of the polysilicon layer 908 above the other fins may not directly correspond to aspects of FIG. 6 in that a gate and a contact for a wordline coupled with the gate may be situated in the between-fin floating-gate memory unit bitcell 600 such that they would be seen in a different cross-sectional view.

Figure 10:
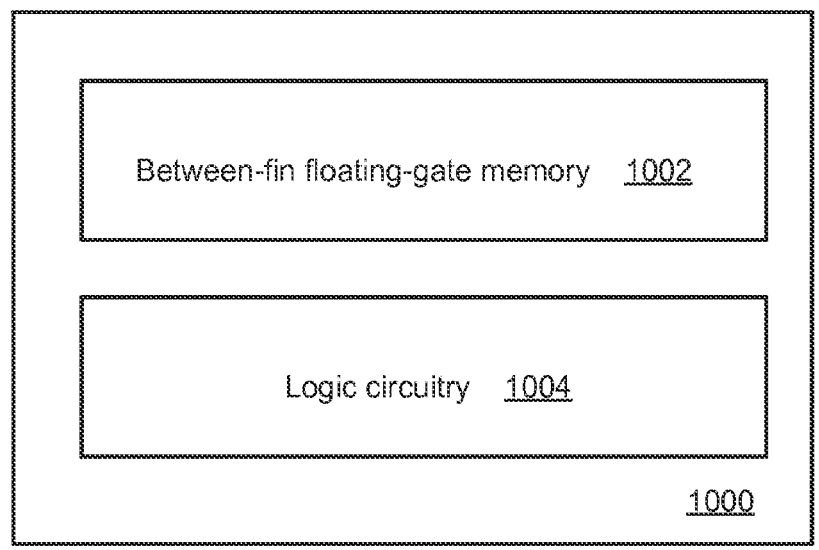
FIG. 10 schematically illustrates a device having a between-fin floating-gate memory structure and a logic circuit, in accordance with some embodiments.

FIG. 10 schematically illustrates a device 1000 having a between-fin floating-gate memory structure 1002 coupled with logic circuitry 1004, in accordance with some embodiments. The device 1000 may be a system on a chip (SoC) in some embodiments, with the between-fin floating-gate memory structure 1002 and the logic circuitry 1004 formed on the same semiconductor substrate in various embodiments. The between-fin floating-gate memory structure 1002 may include unit bitcells configured as described with respect to the between-fin floating-gate memory unit bitcell 202 of FIG. 2, the unit bitcell 302 of FIG. 3, the between-fin floating-gate memory unit bitcell 600 of FIG. 6, and/or the unit bitcell 700 of FIG. 7, in various embodiments. The logic circuitry 1004 may include a processor in some embodiments that may include a plurality of metal oxide semiconductor transistors. In various embodiments, aspects of the device 1000, by integrating the floating-gate memory structure 1002 with the logic circuitry 1004, may allow the device 1000 to have a relatively low standby power and may have a lower production cost than implementing the memory and logic as discrete components. In some embodiments, the logic circuitry 1004 may be a logic structure or module such as a logic circuit including a plurality of transistors that may be metal-oxide-semiconductor transistors.

Figure 11:
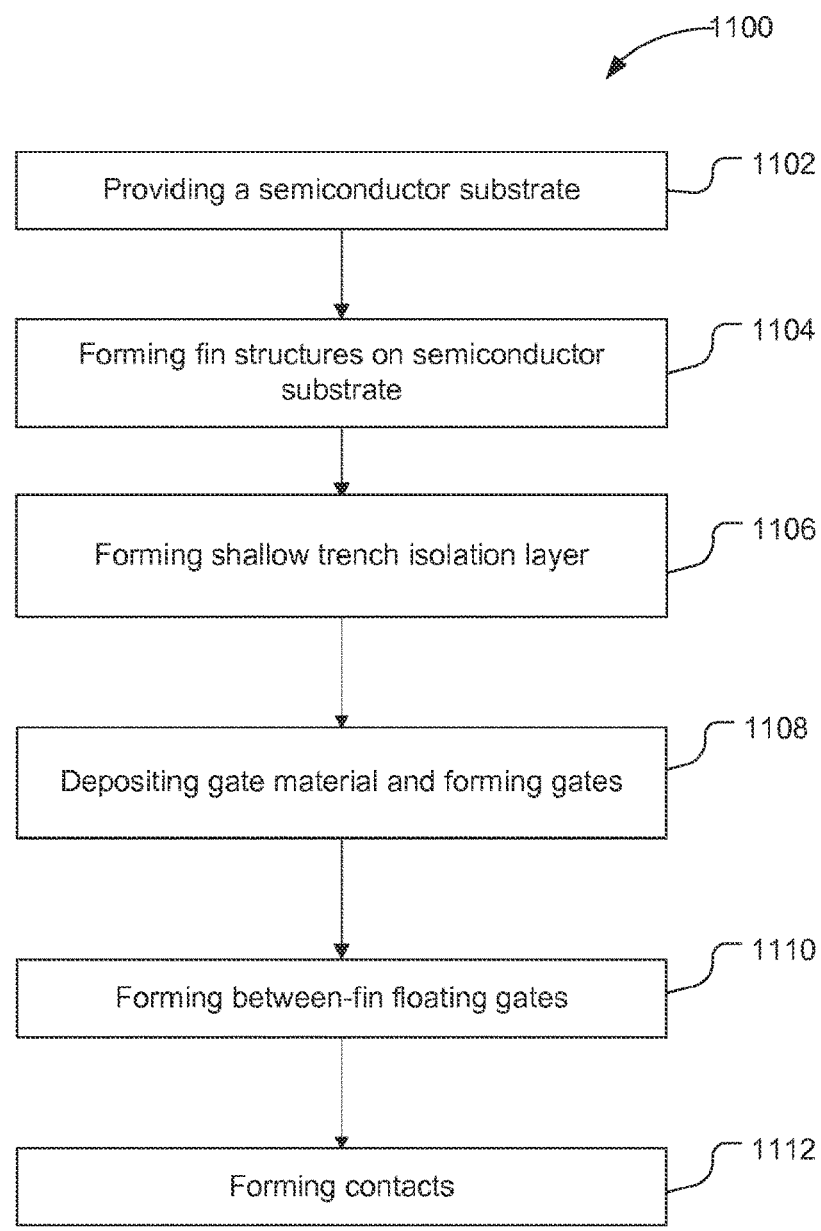
FIG. 11 is a flow diagram for a method of fabricating a between-fin floating-gate memory configuration of an IC device, in accordance with some embodiments.

FIG. 11 is a flow diagram for a method 1100 of fabricating a floating-gate memory configuration of an IC device (e.g, the IC device 100 of FIG. 1 including the between-fin floating-gate memory unit bitcell 202 of FIG. 2 and/or the between-fin floating-gate memory unit bitcell 600 of FIG. 6), in accordance with some embodiments. The method 1100 may comport with techniques, materials, and/or configurations described in connection with FIGS. 1-10. At a block 1102, a semiconductor substrate may be provided. The semiconductor substrate may be the semiconductor substrate 904 described with respect to FIG. 9 of the IC 100 of FIG. 1 in various embodiments. In some embodiments, a wafer may be provided for fabrication of IC devices.

At a block 1104, fin structures may be formed on the semiconductor substrate. In various embodiments, the fin structures may be the fin structures 204, 206, 208 of FIG. 2 or the fin structures 602, 604, 606 of FIG. 6, for example. In various embodiments, the fin structures may be patterned using, for example, lithography and/or etch processes. In some embodiments, a hardmask (e.g., silicon nitride) may be deposited and patterned with a design of the fin structures. An etch process may remove material underlying the hardmask pattern such that the fin structures are formed. In some embodiments, a stack of layers may be formed before removal of material using lithography and/or etch processes. In various embodiments, the stack of layers may be formed with an epitaxial deposition process where each layer is epitaxially coupled together. In embodiments, the stack of layers may include one or more buffer layers, isolation layers, channel layers, or other layers. In some embodiments, the etch process may remove all material of the stack of layers except the material of the stack of layers of the fin structures. The etch process may further remove a portion of the semiconductor substrate. For example, in some embodiments, the etch process to form the fin structures may remove material of the semiconductor substrate to a depth of 1 to 10,000 Angstroms into the semiconductor substrate.

At a block 1106, a shallow trench isolation (STI) layer that may be an oxide layer may be formed on the semiconductor substrate. In some embodiments, the STI layer may correspond to the oxide layer 906 of FIG. 9.

At a block 1108, gate material may be deposited or formed. In various embodiments, the gate material may be polysilicon. In some embodiments, the gate material may be or include metal or another material. In various embodiments, gates such as the gate 210 of FIG. 2 or the gate 608 of FIG. 6 may be formed.

The gate(s) may be formed using a patterning process such as a replacement metal gate (RMG) process. For example, a dummy gate material (e.g., sacrificial material) such as polysilicon may be conformally deposited to cover the fin structures and regions between the fin structures. The dummy gate material may be patterned to form one or more dummy gate(s). An electrically insulative material such as, for example, ILD material may be deposited to fill regions between individual fin structures of the fin structures. The ILD material may be polished to be planar with a top of the dummy gate(s). In this regard, the gates may be disposed in the deposited ILD material 114. An etch process may be used to selectively remove the material of the dummy gate(s) to expose portions of the fin structures where the gate(s) are to be formed.

In some embodiments, a gate dielectric film may be deposited on the exposed portions of the fin structures and gate material may be deposited on the gate dielectric film to form a gate having tri-gate and/or dual-gate configurations. In other embodiments, the exposed portions of the fin structures may undergo a selective etch process that substantially removes material of one or more isolation layers without significantly removing material of one or more channel layers. The gate materials may be deposited by atomic layer deposition (ALD) or any other suitable deposition process. Subsequent to depositing the gate materials to form the gate(s), the IC device may be polished to provide a planar surface at the top of the gate(s) with the ILD material. Other suitable techniques may be used to form the gate(s) in other embodiments.

At a block 1110, between-fin floating gates may be formed. In various embodiments, the between-fin floating gates may be formed using lithography and/or etch processes to remove at least a portion of gate material such as polysilicon. In some embodiments, the removed gate material may include or be a metal or other material. In various embodiments, the between-fin floating gates may be the floating gate 212 of FIG. 2, the floating gates 612, 614 of FIG. 6, or the floating gates 920, 922 of FIG. 9, for example.

At a block 1112, contacts, may be formed. In embodiments, the contacts may include diffusion contacts, bitline contacts, wordline contacts, and source contacts. In various embodiments, the contacts may include the contacts 214, 216, 218, 220, 222 of FIG. 2, the contact 616 of FIG. 6, the contact 910 of FIG. 9, and/or one or more other contacts of the floating-gate memory structures described with respect to FIGS. 1-10 for example.

In some embodiments, the one or more contacts may be formed in an electrically insulative layer formed over the gates. For example, ILD material may be deposited to form a layer (e.g., second ILD layer) over the gates and previously deposited ILD material (eg., first ILD layer). The ILD material disposed on the gates may be polished to have a planar surface and then patterned to allow removal of material (e.g., by etching) in the regions where the contacts are to be formed. In this regard, the contacts may be formed in the second ILD layer. The ILD material and/or the material of one or more isolation layers may be removed by etching processes that may form contact trenches. In embodiments where the material of the isolation layers and the ILD material are the same, a single etch process may be used. In some embodiments, the contact trenches may be formed using a patterning process that does not utilize a sacrificial material. Thus, the contacts may have a more tapered profile relative to the profile of the gates in some embodiments.

In some embodiments, one or more channel regions may be doped where one or more contacts are to be formed. For example, the channel regions for N-type devices may be doped with N-type dopants and the channel regions for P-type devices may be doped with P-type dopants. In some embodiments, for an N-type channel region, the channel regions may be doped with silicon (Si), sulfur (S), tellurium (Te), or combinations thereof. For a P-type channel region, the channel regions may be doped with beryllium (Be), carbon (C), or combinations thereof. Other impurities or techniques may be used to dope the channel regions in various embodiments.

An electrically conductive material may be deposited to substantially fill the contact trenches. In some embodiments, the electrically conductive material may be deposited by atomic layer deposition (ALD). The electrically conductive material may be deposited to form the contacts using other deposition techniques in other embodiments.

Each of the contacts may be independently formed using a separate patterning process in some embodiments owing to potentially different materials to be etched and/or depths and, thus, potentially different etch chemistries and/or etch times. In some embodiments, some or all contacts may be simultaneously formed owing to the potentially similar depths and/or materials of the contact trenches.

Figure 12:
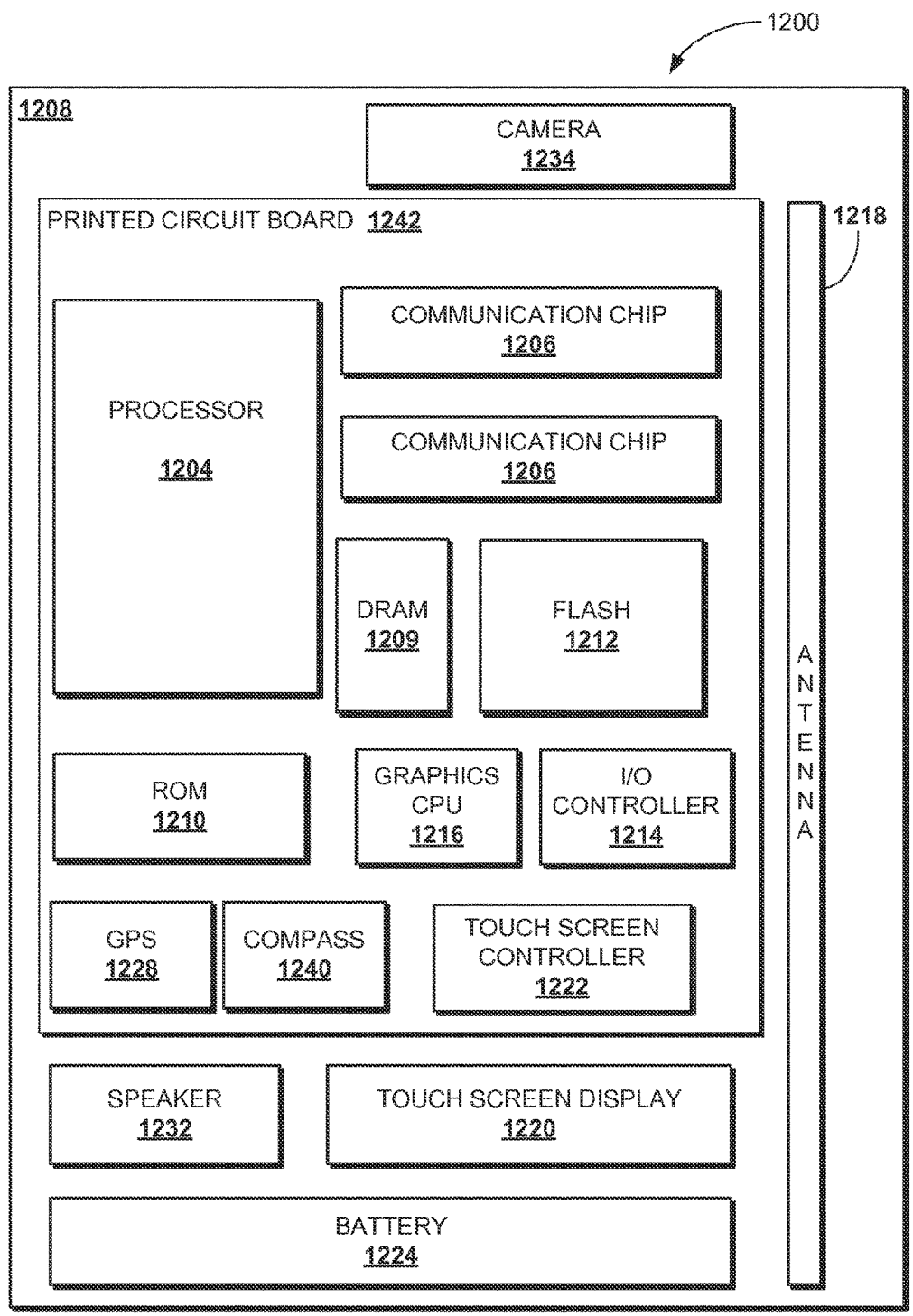
FIG. 12 schematically illustrates a computing device in accordance with some embodiments.

Embodiments of the present disclosure may be implemented into a system using any suitable hardware and/or software to configure as desired. FIG. 12 schematically illustrates an example computing device 1200 that includes a floating-gate memory structure (e.g., between-fin floating-gate memory unit bitcell 202 of FIG. 2 or between-fin floating-gate memory unit bitcell 600 of FIG. 6), as described herein, in accordance with some embodiments. The computing device 1200 may include a board such as a printed circuit board (PCB) 1242 that may be in a housing 1208 in some embodiments. In some embodiments, the board may be a motherboard. The PCB 1242 may include a number of components, including but not limited to a processor 1204 and at least one communication chip 1206. The processor 1204 may be physically and electrically coupled to the PCB 1242. In some embodiments the at least one communication chip 1206 may also be physically and electrically coupled to the PCB 1242. In various embodiments, the communication chip 1206 may be part of the processor 1204. Various components of the computing device 1200 may be coupled with each other without employment of the PCB 1242 in some embodiments.

Depending on its applications, computing device 1200 may include other components that may or may not be physically or electrically coupled with the PCB 1242. These other components may include, but are not limited to, volatile memory (e.g., dynamic random access memory 1209, also referred to as "DRAM"), non-volatile memory (e.g., read only memory 1210, also referred to as "ROM"), flash memory 1212, an input/output controller 1214, a digital signal processor (not shown), a crypto processor (not shown), a graphics processor 1216, one or more antenna 1218, a display (not shown), a touchscreen display 1220, a touchscreen controller 1222, a battery 1224, an audio codec (not shown), a video codec (not shown), a chipset (not shown), a power amplifier (not shown), a global positioning system ("GPS") device 1228, a compass 1240, an accelerometer (not shown), a gyroscope (not shown), a speaker 1232, a camera 1234, or a mass storage device (such as hard disk drive, a solid state drive, compact disk (CD), digital versatile disk (DVD), and so forth)(not shown). In some embodiments, various components may be integrated with other components to form a system-on-chip ("SoC"). In some embodiments, some components, such as DRAM 1209, may be embedded on other components such as the processor 1204.

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards, protocols, methods, or topologies including but not limited to Institute for Electrical and Electronic Engineers (IEEE) standards including WiGig, Wi-Fi (IEEE 802.11 family), WiMAX (IEEE 802.16 family), IEEE 802.20, IEEE 802.15.4, wireless mesh networking, wireless personal/local/metropolitan area network technologies, IEEE 802.22, LoRa™, SigFox, long term evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1206 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as WiGig, Wi-Fi, and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 may include an integrated circuit die packaged within the processor 1204. In some embodiments, the integrated circuit die (e.g., dies 101 of FIG. 1) of the processor 1204 may include one or more devices (e.g., IC device 100 of FIG. 1), including semi-volatile between-fin floating-gate memory (e.g., between-fin floating-gate memory unit bitcell 202 of FIG. 2 or unit bitcell 600 of FIG. 6) as described herein. The term "processor" may refer to any device or portion of a device that processes electronic data from registers and/or memory to transform that electronic data into other electronic data that may be stored in registers and/or memory.

The communication chip 1206 also may include an integrated circuit die packaged within the communication chip 1206. In accordance with another embodiment, the integrated circuit die of the communication chip may include one or more devices (e.g., IC device 100 of FIG. 1), including semi-volatile between-fin floating-gate memory (e.g., between-fin floating-gate memory unit bitcell 202 of FIG. 2 or between-fin floating-gate memory unit bitcell 600 of FIG. 6) as described herein.

In further embodiments, another component (e.g., memory device or other integrated circuit device) housed within the computing device 1200 may include an integrated circuit die that includes one or more devices (e.g., IC device 100 of FIG. 1), including semi-volatile between-fin floating-gate memory (e.g., between-fin floating-gate memory unit bitcell 202 of FIG. 2 or between-fin floating-gate memory unit bitcell 600 of FIG. 6) as described herein.

In various embodiments, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a wearable electronic device or a digital video recorder. In some embodiments, the computing device 1200 may be or be included in an internet or things (IoT) device such as an IoT appliance, lightbulb, thermostat, or other device. In further embodiments, the computing device 1200 may be any other electronic device that processes data.

EXAMPLES

Example 1 may include an apparatus comprising: a semiconductor substrate; and a floating-gate memory structure formed on the semiconductor substrate, wherein the floating-gate memory structure includes a bitcell having: a first fin structure extending from the substrate; a second fin structure extending from the substrate; a third fin structure extending from the substrate; an oxide layer disposed between the first and second fin structures and between the second and third fin structures; a gate of a first transistor, the gate disposed on the oxide layer and coupled with and extending over a top of the first fin structure; and a floating gate of a second transistor, the floating gate disposed on the oxide layer between the second and third fin structures.

Example 2 may include the subject matter of Example 1, further comprising a logic structure formed on the semiconductor substrate and coupled with the floating-gate memory structure, wherein the logic structure includes a plurality of metal-oxide-semiconductor transistors.

Example 3 may include the subject matter of Example 2, wherein the logic structure is part of a processor.

Example 4 may include the subject matter of any one of Examples 1-3, wherein dimensions of the bitcell are 2.5 diffusion pitch by 1.5 polysilicon pitch.

Example 5 may include the subject matter of any one of Examples 1-3, wherein dimensions of the bitcell are 2 diffusion pitch by 2 polysilicon pitch.

Example 6 may include the subject matter of any one of Examples 1-5, wherein the first transistor is a P-type metal-oxide-semiconductor transistor.

Example 7 may include the subject matter of any one of Examples 1-5, wherein the first transistor is an N-type metal-oxide-semiconductor transistor.

Example 8 may include the subject matter of any one of Examples 1-7, further comprising a gate contact coupled with the gate, wherein the gate contact includes at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

Example 9 may include the subject matter of any one of Examples 1-8, wherein the oxide layer below the floating gate is less than or equal to 3 nanometers equivalent oxide thickness.

Example 10 may include the subject matter of any one of Examples 1-9, further comprising: a diffusion contact coupled with the first fin structure and the second fin structure; a contact for a bitline coupled with the first fin structure; and a contact for source coupled with the third fin structure.

Example 11 may include the subject matter of any one of Examples 1-10, further comprising: a source line coupled with the first, second, and third fin structures at a first side of the bitcell; and a contact for a bitline coupled with the second fin structure at a second side of the bitcell, wherein: the gate extends over the top of the first, second, and third fin structures at a location between the contact for the bitline and the source line; the floating gate is a first floating gate disposed between the second fin structure and the third fin structure at a location between the gate and the source line; and the apparatus further includes a second floating gate of the second transistor disposed between the first fin structure and the second fin structure at a location between the gate and the source line.

Example 12 may include a method, comprising: providing a semiconductor substrate; and forming a floating-gate memory structure on the semiconductor substrate, wherein forming the floating-gate memory structure includes: forming first, second, and third fin structures extending from the semiconductor substrate; depositing an oxide layer between the first and second fin structures and between the second and third fin structures; forming a gate of a first transistor, the gate disposed on the oxide layer and extending over a top of the first fin structure; and forming a floating gate of a second transistor, the floating gate disposed on the oxide layer between the second and third fin structures.

Example 13 may include the subject matter of Example 12, further comprising forming a logic structure on the semiconductor substrate coupled with the floating-gate memory structure, wherein the logic structure includes a plurality of metal-oxide-semiconductor transistors.

Example 14 may include the subject matter of any one of Examples 12-13, wherein forming the floating-gate memory structure further includes coupling a gate contact with the gate, wherein the gate contact includes at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

Example 15 may include the subject matter of any one of Examples 12-14, wherein the oxide layer below the floating gate is less than or equal to 3 nanometers equivalent oxide thickness.

Example 16 may include the subject matter of any one of Examples 12-15, wherein forming the floating-gate memory structure further includes: coupling a diffusion contact with the first fin structure and the second fin structure; coupling a contact for a bitline with the first fin structure; and coupling a contact for source with the third fin structure.

Example 17 may include the subject matter of Example 16, wherein the gate is a polysilicon gate and forming the polysilicon gate and forming the floating gate includes: forming a polysilicon gate layer that extends above the first, second, and third fin structures; and removing a portion of the polysilicon gate layer above and between the second and third fin structures to form the floating gate between the second fin structure and the third fin structure, wherein the polysilicon gate includes a portion of the polysilicon gate layer that was not removed from above the first fin structure.

Example 18 may include the subject matter of any one of Examples 12-17, wherein forming the floating-gate memory structure further includes: coupling a source line with the first, second, and third fin structures at a first side of a bitcell in the floating-gate memory structure; and coupling a contact for a bitline with the second fin structure at a second side of the bitcell, wherein: the gate extends over the top of the first, second, and third fin structures at a location between the contact for the bitline and the source line; the floating gate is a first floating gate disposed between the second fin structure and the third fin structure at a location between the gate and the source line; and forming the floating-gate memory structure further includes forming a second floating gate of the second transistor disposed between the first fin structure and the second fin structure at a location between the gate and the source line.

Example 19 may include a computing device comprising: a semiconductor substrate; a processor; an output device coupled with the processor; and a floating-gate memory structure coupled with the processor that includes a bitcell having: a first fin structure extending from the semiconductor substrate; a second fin structure extending from the semiconductor substrate; a third fin structure extending from the semiconductor substrate; an oxide layer disposed between the first and second fin structures and between the second and third fin structures; a gate of a first transistor, the gate disposed on the oxide layer and coupled with and extending over a top of the first fin structure; and a floating gate of a second transistor, the floating gate disposed on the oxide layer between the second and third fin structures.

Example 20 may include the subject matter of Example 19, wherein the processor and the floating-gate memory structure are part of a system on a chip (SoC).

Example 21 may include the subject matter of any one of Examples 19-20, wherein the floating-gate memory structure includes an array of bitcells accessed with a plurality of wordlines and a plurality of bitlines.

Example 22 may include the subject matter of Example 21, wherein the array of bitcells includes a plurality of fin structures arranged in a plurality of rows, with every other fin structure having a contact for ground.

Example 23 may include the subject matter of any one of Examples 19-22, wherein the bitcell further includes a gate contact coupled with the gate, wherein the gate includes at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

Example 24 may include the subject matter of any one of Examples 19-23, wherein the computing device is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus comprising:
a semiconductor substrate; and
a floating-gate memory structure formed on the semiconductor substrate, wherein the floating-gate memory structure includes a bitcell having:
a first fin structure extending from the substrate;
a second fin structure extending from the substrate;
a third fin structure extending from the substrate;
an oxide layer disposed between the first and second fin structures and between the second and third fin structures;
a gate of a first transistor, the gate disposed on the oxide layer and coupled with and extending over a top of the first fin structure;
a floating gate of a second transistor, the floating gate disposed on the oxide layer between the second and third fin structures;
a diffusion contact coupled with the first fin structure and the second fin structure;
a contact for a bitline coupled with the first fin structure; and
a contact for a source coupled with the third fin structure.

2. The apparatus of claim 1, further comprising a logic structure formed on the semiconductor substrate and coupled with the floating-gate memory structure, wherein the logic structure includes a plurality of metal-oxide-semiconductor transistors.

3. The apparatus of claim 2, wherein the logic structure is part of a processor.

4. The apparatus of claim 1, wherein dimensions of the bitcell are 2.5 diffusion pitch by 1.5 polysilicon pitch.

5. The apparatus of claim 1, wherein dimensions of the bitcell are 2 diffusion pitch by 2 polysilicon pitch.

6. The apparatus of claim 1, wherein the first transistor is a P-type metal-oxide-semiconductor transistor.

7. The apparatus of claim 1, wherein the first transistor is an N-type metal-oxide-semiconductor transistor.

8. The apparatus of claim 1, further comprising a gate contact coupled with the gate, wherein the gate contact includes at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

9. The apparatus of claim 1, wherein the oxide layer below the floating gate is less than or equal to 3 nanometers equivalent oxide thickness.

10. An apparatus comprising:
a semiconductor substrate; and
a floating-gate memory structure formed on the semiconductor substrate, wherein the floating-gate memory structure includes a bitcell having:
a first fin structure extending from the substrate;
a second fin structure extending from the substrate;
a third fin structure extending from the substrate;
an oxide layer disposed between the first and second fin structures and between the second and third fin structures;
a gate of a first transistor, the gate disposed on the oxide layer and coupled with and extending over a top of the first fin structure;
a floating gate of a second transistor, the floating gate disposed on the oxide layer between the second and third fin structures;
a source line coupled with the first, second, and third fin structures at a first side of the bitcell; and
a contact for a bitline coupled with the second fin structure at a second side of the bitcell, wherein:
the gate extends over the top of the first, second, and third fin structures at a location between the contact for the bitline and the source line;
the floating gate is a first floating gate disposed between the second fin structure and the third fin structure at a location between the gate and the source line; and
the apparatus further includes a second floating gate of the second transistor disposed between the first fin structure and the second fin structure at a location between the gate and the source line.

11. The apparatus of claim 10, further comprising a gate contact coupled with the gate, wherein the gate contact includes at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

12. The apparatus of claim 10, wherein the oxide layer below the floating gate is less than or equal to 3 nanometers equivalent oxide thickness.

13. The apparatus of claim 10, further comprising a logic structure formed on the semiconductor substrate and coupled with the floating-gate memory structure, wherein the logic structure includes a plurality of metal-oxide-semiconductor transistors.

14. A method, comprising:
providing a semiconductor substrate; and
forming a floating-gate memory structure on the semiconductor substrate, wherein forming the floating-gate memory structure includes:
forming first, second, and third fin structures extending from the semiconductor substrate;
depositing an oxide layer between the first and second fin structures and between the second and third fin structures;
forming a gate of a first transistor, the gate disposed on the oxide layer and extending over a top of the first fin structure;
forming a floating gate of a second transistor, the floating gate disposed on the oxide layer between the second and third fin structures;
coupling a diffusion contact with the first fin structure and the second fin structure;

coupling a contact for a bitline with the first fin structure; and coupling a contact for a source with the third fin structure.

15. The method of claim 14, further comprising forming a logic structure on the semiconductor substrate coupled with the floating-gate memory structure, wherein the logic structure includes a plurality of metal-oxide-semiconductor transistors.

16. The method of claim 14, wherein forming the floating-gate memory structure further includes coupling a gate contact with the gate, wherein the gate contact includes at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

17. The method of claim 14, wherein the oxide layer below the floating gate is less than or equal to 3 nanometers equivalent oxide thickness.

18. The method of claim 14, wherein the gate is a polysilicon gate and forming the polysilicon gate and forming the floating gate includes:

forming a polysilicon gate layer that extends above the first, second, and third fin structures; and removing a portion of the polysilicon gate layer above and between the second and third fin structures to form the floating gate between the second fin structure and the third fin structure, wherein the polysilicon gate includes a portion of the polysilicon gate layer that was not removed from above the first fin structure.

19. A computing device comprising:

a semiconductor substrate;

a processor;

an output device coupled with the processor; and a floating-gate memory structure coupled with the processor that includes a bitcell having:

a first fin structure extending from the semiconductor substrate;

a second fin structure extending from the semiconductor substrate;

a third fin structure extending from the semiconductor substrate;

an oxide layer disposed between the first and second fin structures and between the second and third fin structures;

a gate of a first transistor, the gate disposed on the oxide layer and coupled with and extending over a top of the first fin structure;

a floating gate of a second transistor, the floating gate disposed on the oxide layer between the second and third fin structures;

a diffusion contact coupled with the first fin structure and the second fin structure;

a contact for a bitline coupled with the first fin structure; and a contact for a source coupled with the third fin structure.

20. The computing device of claim 19, wherein the processor and the floating-gate memory structure are part of a system on a chip (SoC).

21. The computing device of claim 19, wherein the floating-gate memory structure includes an array of bitcells accessed with a plurality of wordlines and a plurality of bitlines.

22. The computing device of claim 21, wherein the array of bitcells includes a plurality of fin structures arranged in a plurality of rows, with every other fin structure having a contact for ground.

23. The computing device of claim 19, wherein the bitcell further includes a gate contact coupled with the gate, wherein the gate includes at least one of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al).

24. The computing device of claim 19, wherein the computing device is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

* * * * *